(12) United States Patent
Haran et al.

(10) Patent No.: US 10,718,940 B2
(45) Date of Patent: Jul. 21, 2020

(54) ENVELOPE DETECTION CIRCUIT FOR DETECTION OF OPENING ANGLE OF A MOVABLE MEMS MIRROR

(71) Applicant: STMicroelectronics Ltd, Netanya (IL)

(72) Inventors: Elik Haran, Kfar Saba (IL); Offir Duvdevany, Tel Aviv (IL); Naomi Petrushevsky, Yavne (IL)

(73) Assignee: STMicroelectronics Ltd, Netanya (IL)

( * ) Notice: Subject to any disclaimer, the term of this patent is extended or adjusted under 35 U.S.C. 154(b) by 170 days.

(21) Appl. No.: 15/838,843

(22) Filed: Dec. 12, 2017

(65) Prior Publication Data

US 2018/0164579 A1 Jun. 14, 2018

Related U.S. Application Data

(60) Provisional application No. 62/432,896, filed on Dec. 12, 2016.

(51) Int. Cl.
  *G02B 26/08* (2006.01)
  *G01R 19/04* (2006.01)
  *H02P 25/032* (2016.01)
  *G02B 26/10* (2006.01)

(52) U.S. Cl.
  CPC .......... *G02B 26/085* (2013.01); *G01R 19/04* (2013.01); *G02B 26/0833* (2013.01); *G02B 26/105* (2013.01); *H02P 25/032* (2016.02)

(58) Field of Classification Search
  None
  See application file for complete search history.

(56) References Cited

U.S. PATENT DOCUMENTS

| 4,686,363 | A | * | 8/1987 | Schoon | ................ | H04N 1/053 250/235 |
|---|---|---|---|---|---|---|
| 2007/0035799 | A1 | * | 2/2007 | Gomi | ................ | G02B 26/105 359/213.1 |
| 2009/0323149 | A1 | * | 12/2009 | Mizukami | ............ | G02B 6/2931 359/221.2 |
| 2017/0131540 | A1 | * | 5/2017 | Kolodkin | ............. | G02B 26/085 |
| 2018/0164579 | A1 | * | 6/2018 | Haran | ................ | G02B 26/085 |
| 2018/0321483 | A1 | * | 11/2018 | Haran | ................ | G02B 26/085 |
| 2018/0356627 | A1 | * | 12/2018 | Haran | ................ | G02B 26/105 |

* cited by examiner

*Primary Examiner* — Jennifer D. Carruth
(74) *Attorney, Agent, or Firm* — Crowe & Dunlevy

(57) ABSTRACT

Disclosed herein is an electronic device that includes a peak detection circuit configured to receive a mirror sense signal from an oscillating mirror and to generate peak information for a mirror period as a function thereof. The electronic device includes a mirror control circuit that estimates an opening angle of the oscillating mirror as a function of the peak information, generates a control signal for the oscillating mirror as a function of the estimated opening angle, and resets the peak detection circuit at an end of the mirror period.

20 Claims, 10 Drawing Sheets

ENVELOPE DETECTION CIRCUIT FOR DETECTION OF OPENING ANGLE OF A MOVABLE MEMS MIRROR

RELATED APPLICATION

This application is a utility application claiming priority from previously filed provisional application, U.S. Appln. Ser. No. 62/432,896, entitled ENVELOPE DETECTION CIRCUIT FOR DETECTION OF OPENING ANGLE OF A MOVABLE MEMS MIRROR, having a filing date of Dec. 12, 2016.

TECHNICAL FIELD

This disclosure relates to MEMS mirrors for scanning or deflecting light beams, and, in particular, to techniques and circuits for determining when MEMS mirrors have experienced failures.

BACKGROUND

Certain devices such as wafer defect scanners, laser printers, document scanners, projectors and the like often employ a collimated laser beam that scans across a flat surface in a straight line path. These devices employ tilting mirrors to deflect the beam to perform the scanning. These tilting mirrors may be, or may include, Micro Electro Mechanical Systems ("MEMS") devices. The actuation of mirrors used in MEMS devices, referred to herein as MEMS mirrors, can be via the electromagnetic, electrostatic, piezoelectric, and thermoelectric effects, depending on application.

One type of common MEMS mirror includes a stator and a rotor, with the rotor or structures carried by the rotor being reflective. The stator and/or rotor are driven with a drive signal which results in the rotor oscillating with respect to the stator, thereby changing the angle of reflectance of an incident light beam on the rotor. By oscillating the rotor between two orientations, an opening angle of the mirror is defined, and scanning of the light beam across the flat surface is accomplished.

Precise control of the opening angle of the mirror is desirable for the precise application in which such mirrors are used. In order to precisely control the opening angle of the mirror, it is desirable to know the opening angle of the mirror. While conventional techniques for estimating the opening angle of the mirror are known, they are subject to various degrees of inaccuracy. Therefore, further development in this area is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is an electronic device that includes a peak detection circuit configured to receive a mirror sense signal from an oscillating mirror and to generate peak information for a mirror period as a function thereof. The electronic device includes a mirror control circuit that estimates an opening angle of the oscillating mirror as a function of the peak information, generates a control signal for the oscillating mirror as a function of the estimated opening angle, and resets the peak detection circuit at an end of the mirror period.

The peak information may include an amplitude of the mirror sense signal. The peak information may include an envelope of the mirror sense signal.

The peak detection circuit may include an envelope detector.

The peak detection circuit may include a positive peak detector configured to determine a positive peak of the mirror sense signal, a negative peak detector configured to determine a negative peak of the mirror sense signal, and a combiner to generate the peak information as an envelope of the mirror sense signal by combining the positive peak and negative peak.

The positive peak detector may include a first amplifier having a non-inverting input terminal receiving the mirror sense signal, an inverting terminal coupled to an output node as feedback, and an output. A diode has an anode coupled to the output of the first amplifier and a cathode coupled to the output node. A switched capacitor circuit is coupled between the output node and ground.

The switched capacitor circuit includes a capacitor coupled between the output node and ground, and a switch coupled in parallel with the capacitor between the output node and ground, the switch being reset by the mirror control circuit at the end of the mirror period.

The negative peak detector may include a first amplifier having a non-inverting input terminal receiving the mirror sense signal, an inverting terminal coupled to an output node as feedback, and an output. A diode may have a cathode coupled to the output of the first amplifier and an anode coupled to the output node. A switched capacitor circuit is coupled between the output node and ground.

The positive peak detector may include a first amplifier having a non-inverting input terminal receiving the mirror sense signal, an inverting terminal coupled to an output node for feedback, and an output. A diode has an anode coupled to the output of the first amplifier and a cathode coupled to an intermediate node. A switched capacitor circuit is coupled between the intermediate node and ground. A second amplifier has a non-inverting terminal coupled to the intermediate node, an inverting terminal coupled to the output node for feedback, and an output coupled to the output node.

The switched capacitor circuit includes a capacitor coupled between the intermediate node and ground, and a switch coupled in parallel with the capacitor between the intermediate node and ground, the switch being reset by the mirror control circuit at the end of the mirror period.

The negative peak detector may include a first amplifier having a non-inverting input terminal receiving the mirror sense signal, an inverting terminal coupled to an output node for feedback, and an output. A diode has a cathode coupled to the output of the first amplifier and an anode coupled to an intermediate node. A switched capacitor circuit is coupled between the intermediate node and ground. A second amplifier has a non-inverting terminal coupled to the intermediate node, an inverting terminal coupled to the output node for feedback, and an output coupled to the output node.

An analog to digital converter may be configured to convert the peak information into digital peak information, and the mirror control circuit may estimate the opening angle as a function of the peak information.

An analog to digital converter may be configured to convert the mirror sense signal into a digital mirror sense signal, and the peak detection circuit may generate the peak information as a function of the digital mirror sense signal.

The peak detection circuit may include a digital positive peak detector configured to determine a positive peak of the mirror sense signal, a digital negative peak detector configured to determine a negative peak of the mirror sense signal, and a combiner to generate the peak information as an envelope of the mirror sense signal by combining the positive digital peak and negative digital peak.

The peak detection circuit may include digital signal processing circuitry configured to determine a positive digital peak of the mirror sense signal, determine a negative digital peak of the mirror sense signal, and generate the peak information as an envelope of the mirror sense signal by combining the positive digital peak and negative digital peak.

Also disclosed herein is a method aspect. The method includes receiving a mirror sense signal from an oscillating mirror, generating peak information for a mirror period as a function of the mirror sense signal using a peak detection circuit, estimating an opening angle of the oscillating mirror as a function of the peak information, and resetting the peak detection circuit at an end of the mirror period.

Additionally disclosed herein is an electronic device that includes an analog to digital converter configured to receive an analog mirror sense signal from an oscillating mirror and to generate a digital mirror sense signal therefrom. This electronic device also includes a digital signal processing block configured cooperate with the analog to digital converter. This digital signal processing block serves to take a first sample of the digital mirror sense signal at a first time where a derivative of capacitance of the digital mirror sense signal crosses zero, take a second sample of the digital mirror sense signal at a second time between a peak of the digital mirror sense signal and the first time, and take a third sample of the digital mirror sense signal at a third time after the digital mirror sense signal has reached a minimum. Control circuitry is configured to determine an opening angle of the oscillating mirror as a function of the first, second, and third samples.

The control circuitry may be configured to determine the opening angle of the oscillating mirror by determining a raw opening angle measurement as a function of the first, second, and third samples, subtracting the raw opening angle measurement from a calibrated opening angle measurement so as to produce an opening angle error, the calibrated opening angle measurement being a known opening angle error at a desired opening angle, and determining the opening angle of the oscillating mirror as a function of the opening angle error.

The raw opening angle measurement may be calculated as:

$$RawOAC_{Measurement} = \left| \frac{s_0 - s_{zeroCross}}{s_1 - s_{zeroCross}} \right|$$

where $RawOAC_{Measurement}$ is the raw opening angle measurement, where $s_{zeroCross}$ is the first sample, where $s_0$ is the second sample, and where $s_1$ is the third sample.

The first time may be a time where a derivative of a capacitance of the oscillating mirror with respect to time is zero. In addition, the digital signal processing block may take the second sample of the digital mirror sense signal at a second time between a minimum of the digital mirror sense signal and the first time. Furthermore, the digital signal processing block may take the second sample of the digital mirror sense signal at a second time between a maximum of the digital mirror sense signal and the first time. The digital signal processing block may take the third sample of the digital mirror sense signal at a third time after the first time and after the digital mirror sense signal has reached a minimum. The digital signal processing block may take the first, second, and third samples after a phase of the mirror sense signal has locked. Alternatively, the digital signal processing block may take the first, second, and third samples regardless of whether or not the phase of the mirror sense signal has locked, but may only consider the taken samples as valid where the phase of the mirror sense signal has locked.

The control circuitry may be further configured to generate a control signal to act as a feedback signal for use in generating a driving the signal for the oscillating mirror.

The control circuitry may be configured to generate a signal for stopping generation of a laser impinging on the oscillating mirror, as a function of a lack of sufficient change in the opening angle of the oscillating mirror over a given period of time.

A method aspect includes receiving an analog mirror sense signal from an oscillating mirror, digitizing the analog mirror sense signal to thereby generate a digital mirror sense signal therefrom, generating a first sample by sampling the digital mirror sense signal at a first time where a derivative of capacitance of the digital mirror sense signal crosses zero, generating a second sample by sampling the digital mirror sense signal at a second time between a peak of the digital mirror sense signal and the first time, and generating a third sample by sampling the digital mirror sense signal at a third time after the digital mirror sense signal has reached a minimum. The method aspect may also include determining an opening angle of the oscillating mirror as a function of the first, second, and third samples.

Another aspect described herein is an electronic device including an analog to digital converter configured to receive an analog mirror sense signal from an oscillating mirror and to generate a digital mirror sense signal therefrom, and control circuitry. The control circuitry is configured to determine a raw opening angle measurement as a function of the digital mirror sense signal, subtract the raw opening angle measurement from a calibrated opening angle measurement so as to produce an opening angle error, the calibrated opening angle measurement being a known opening angle error at a desired opening angle, and determine the opening angle of the oscillating mirror as a function of the opening angle error.

DETAILED DESCRIPTION

Figure 1:
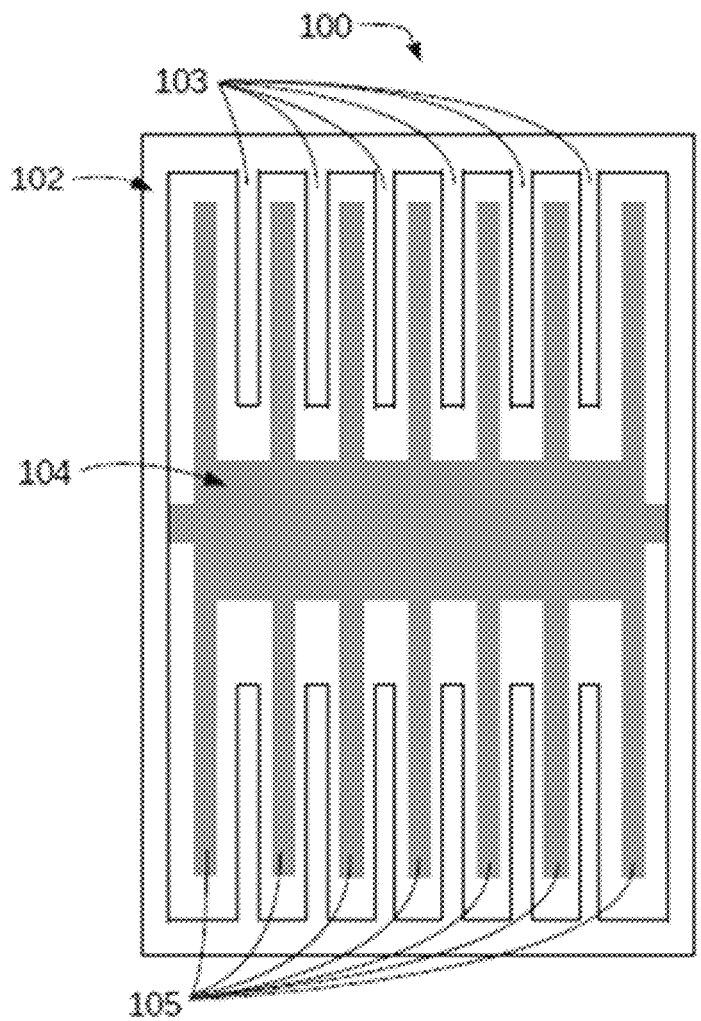
FIG. 1 is a top plan view of a movable MEMS mirror as may be used with the techniques described in this disclosure.

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Like reference numbers in the drawing figures refer to like elements throughout, as well as reference numbers with prime notation, may indicate similar elements in other applications or embodiments.

First, a movable MEMS mirror 100, such as may be used in devices such as wafer defect scanners, laser printers, document scanners, projectors, and pico-projectors, will now be described with reference to FIG. 1. The movable MEMS mirror 100 includes a stator 102 having inwardly projecting fingers 103. A rotor 104 is positioned within the stator 102 and has outwardly projecting fingers 105 that interleave with the inwardly projecting fingers 103 of the stator 102. The rotor 104 oscillates about its axis, oscillating its mirror surface with respect to the stator 102.

Either the stator 102 or the rotor 104 is supplied with a periodic signal, such as a square wave, while the other is supplied with a reference voltage. In the case where the periodic signal has an oscillating square voltage, for example, electrostatic forces cause the rotor 104 to oscillate about its axis relative to the stator 102. In the case where the periodic signal has an oscillating square current, for example, magnetic forces cause the rotor 104 to oscillate about its axis relative to the stator 102. Indeed, the movable MEMS mirror 100 may be driven according to any suitable way known to those of skill in the art, such as through the use of the piezoelectric effect of thermoelectric effect. As another example, the movable MEMS mirror 100 may be driven by driving current flow though a coil, creating an electromagnetic field used to drive the rotation of the rotor 1034. Thus, it should be understood that the techniques, circuits, and methods described herein are applicable to any movable MEMS mirror 102, regardless of how it is driven.

For use in scanning a light beam across a surface, the movable MEMS mirror 100 is driven so that it oscillates at its resonant frequency between two set or controllable oscillation limits. In some cases, the movable MEMS mirror 100 may be driven outside of its resonance frequency, for example driven in a quasi-static or linear mode.

Figure 2:
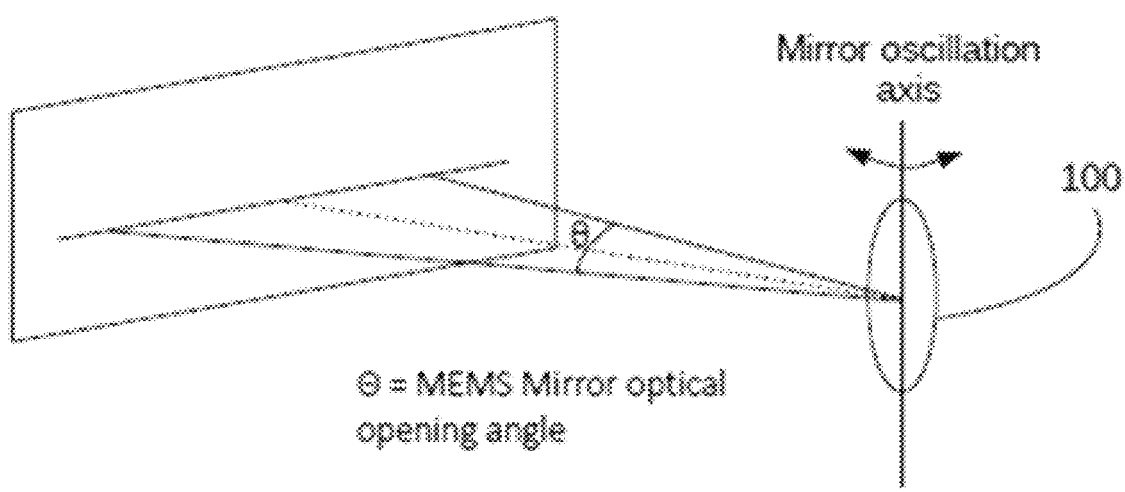
FIG. 2 is a perspective view showing operation of a movable MEMS mirror scanning.

Shown in FIG. 2 is the movable MEMS mirror 100 scanning a light beam across a projection screen between two set rotation limits that define an "opening angle" θ of the movable MEMS mirror 100. The opening angle θ is determined not only by the driving of the movable MEMS mirror 100 but also by the environmental conditions in which the movable MEMS mirror 100 is operating, such as temperature and pressure. Since it is desirable for the movable MEMS mirror 100 to support and be functional in a wide range of temperatures and air pressures, yet maintain a constant opening angle θ, it is desirable to use a closed loop control circuit to control and stabilize the opening angle θ. In addition, upon powerup (and thus the starting of the movable MEMS mirror 100 from a stopped position), it is desirable for the movable MEMS mirror 100 to reach a desired opening angle θ.

Figure 3:
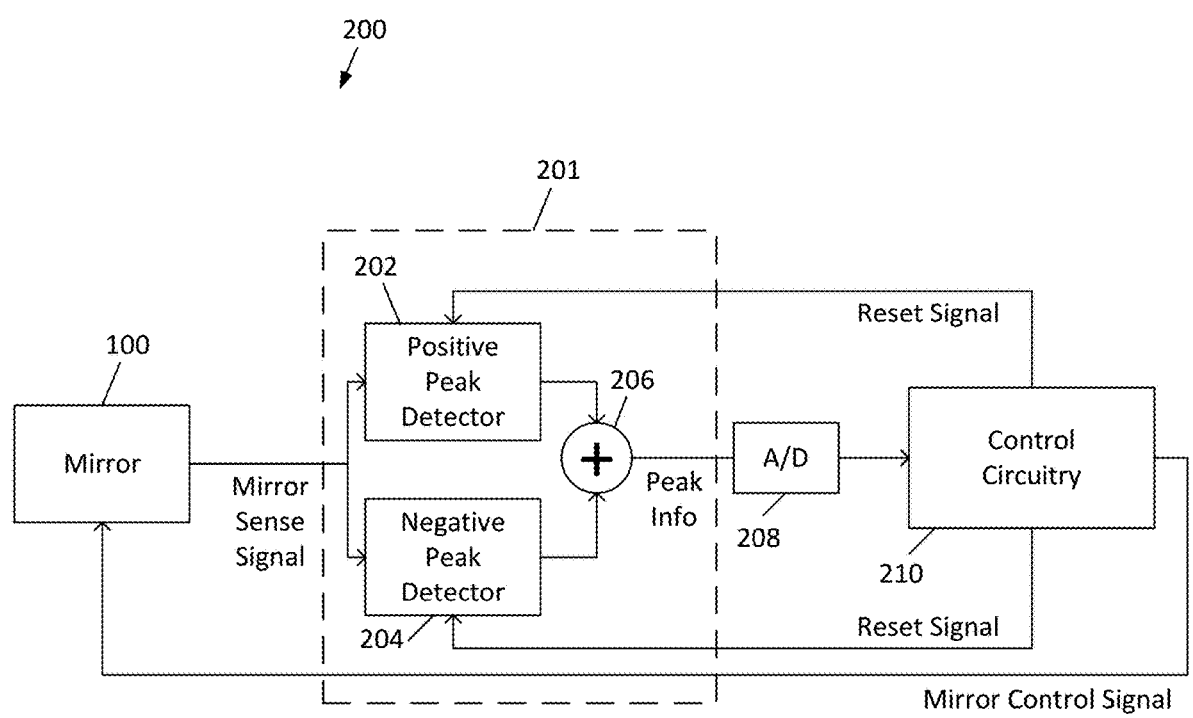
FIG. 3 is a schematic of a circuit for determining the opening angle of the movable MEMS mirror of FIGS. 1-2.

Therefore, referring additionally to FIG. 3, a circuit 200 for determining and controlling the opening angle θ of the movable MEMS mirror 100 is now described. Among other functions, this circuit 200 determines failures of the movable MEMS mirror 100 in cases where the opening angle θ is below a desired threshold. The circuit 200 includes a peak detection circuit 201 that receives a mirror sense signal from the movable MEMS mirror 100 and generates peak information from the mirror sense signal, over a period of the mirror sense signal. That is, the peak information is generated once for each period of the mirror sense signal, although in some cases it may be generated a different number of times per period, such as twice per period, or once per two periods, for example. This peak information may be an amplitude of the mirror sense signal or an envelope of the mirror sense signal, for example.

An analog to digital converter 208 receives the peak information from the peak detection circuit 201, and converts it into a digital peak signal. Control circuit 210 then determines the opening angle θ of the movable MEMS mirror 100 from the digital peak signal. The control circuit 210 generates a mirror control signal to control the movable MEMS mirror 100, from the digital peak signal. The control circuit 200 detects a fault of the movable MEMS mirror 100 based on monitoring the opening angle θ, generates an alert, and projection of the laser onto the movable MEMS mirror 100 may then be stopped. The control circuit 210 generates a reset signal for the peak detection circuit 201 that serves to reset the peak detection circuit 201 at the end of each period of the mirror sense signal, so as to enable capture of the peak value or envelope of the next period.

Further detail of the peak detection circuit 201 will now be described. The peak detection circuit 201 includes a positive peak detector 202 that determines a positive peak of the mirror sense signal and a negative peak detector 204 that determines a negative peak of the mirror sense signal. A combiner 206 combines the positive peak and the negative peak to produce the peak information, such as in the form of an envelope of the mirror sense signal.

Figure 4:
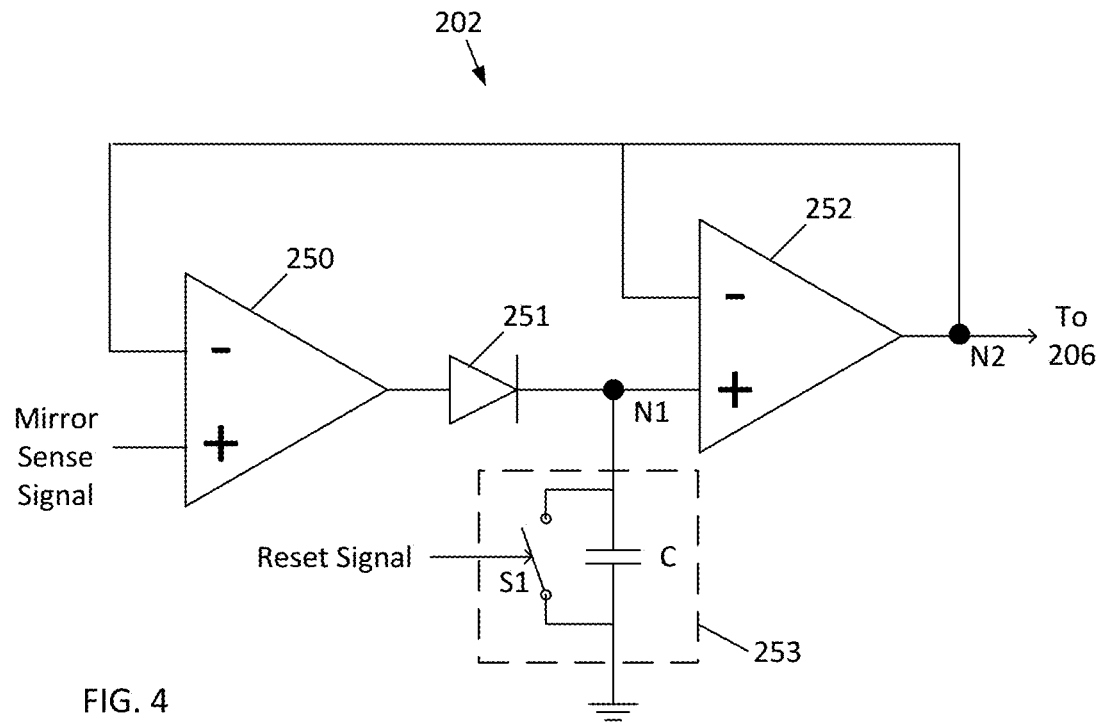
FIG. 4 is a schematic of one possible implementation of the positive peak detector of FIG. 3.
Figure 5:
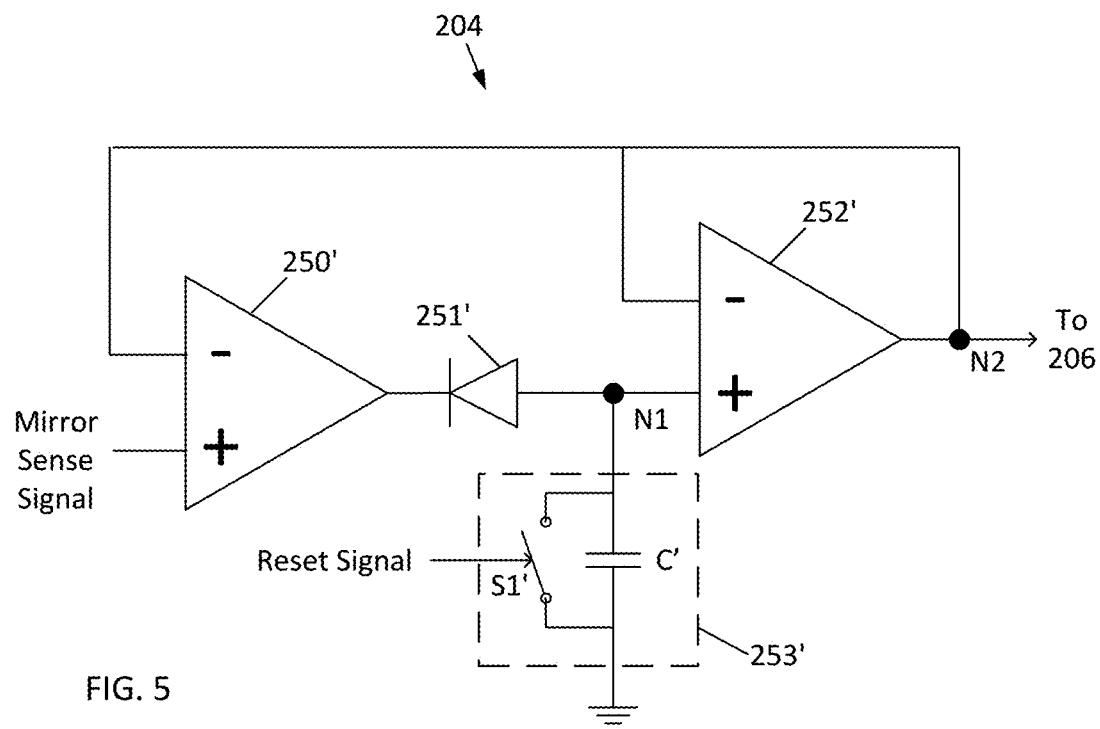
FIG. 5 is a schematic of one possible implementation of the negative peak detector of FIG. 3.

First possible implementations of the positive peak detector 202 and negative peak detector 204 are now described with reference to FIGS. 4-5. The positive peak detector 202 includes a first operational amplifier 250 having a non-inverting terminal receiving as input the mirror sense signal, and receiving feedback from an output node N2. A diode 251 is coupled between an output of the first operational amplifier 250 and node N1, with the anode being coupled to the output of the first operational amplifier 250 and the cathode being coupled to node N1. A second operational amplifier has a non-inverting terminal coupled to the node N1, and an inverting terminal coupled to the output node N2.

A switched capacitor circuit 253 is coupled between the node N1 and ground. The switched capacitor circuit 253 includes a capacitor C and a switch S1 in parallel, with the switch S1 being controlled by the reset signal from the control circuitry 210.

In operation, the mirror sense signal is buffered through the first operational amplifier 250, and through the diode 251 during the portions of the mirror sense signal where the current flow is positive. The reset signal is not asserted prior to the end of the period, and thus the capacitor C charges as the voltage of the mirror sense signal increases. As the voltage of the mirror sense signal decreases, the voltage across the capacitor C remains the same as it is prevented from discharging by the diode 251. Therefore, by the end of the period of the mirror sense signal, the voltage across the capacitor C represents the positive peak of the mirror sense signal.

The second operational amplifier 252 buffers the voltage across the capacitor C through to the output node N2. At the end of the period, the control circuitry 210 asserts the reset signal, closing the switch S1, discharging the capacitor C.

The structure of the negative peak detector 204 is the same as that of the positive peak detector 202, but with the cathode of the diode 251' being coupled to the output of the first operational amplifier 251', and the anode of the diode 251' being coupled to node N1. Operation is also similar to that of the positive peak detector 202, except current flows through the diode 251' when the current of the mirror sense signal is negative, and not positive, to charge the capacitor C'. Thus, as the voltage of the mirror sense signal decreases, the voltage across the capacitor C' is driven lower in the negative direction, yet as the voltage of the mirror sense signal increases, the voltage across the capacitor C' remains the same as it is prevented from discharging by the diode 251'. Therefore, by the end of the period of the mirror sense signal, the voltage across the capacitor C' represents the negative peak of the mirror sense signal.

The second operational amplifier 252' buffers the voltage across the capacitor C' through to the output node N2. At the end of the period, the control circuitry 210 asserts the reset signal, closing the switch S1', discharging the capacitor C'.

Figure 6:
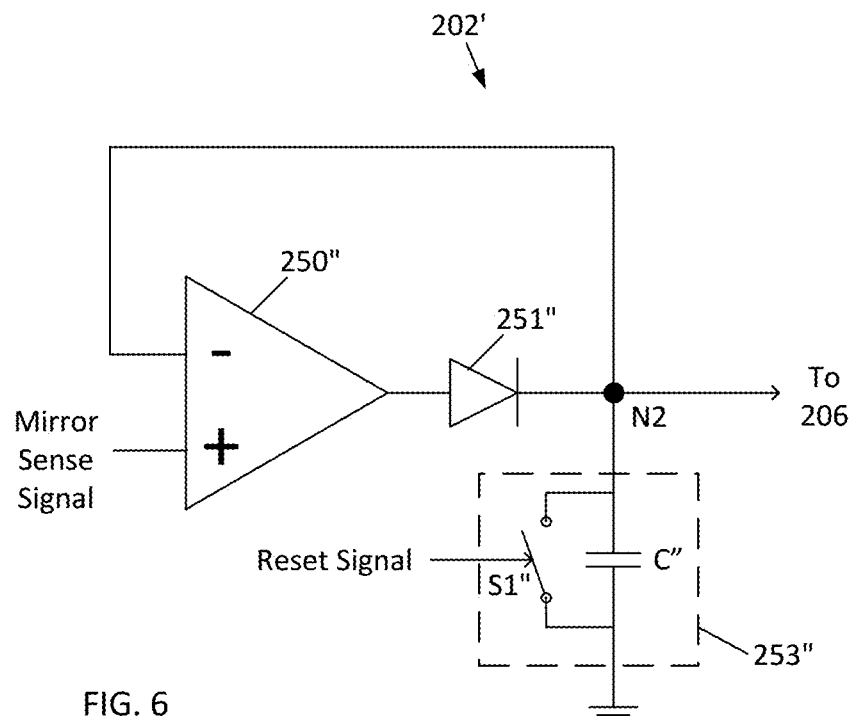
FIG. 6 is a schematic of another possible implementation of the positive peak detector of FIG. 3.
Figure 7:
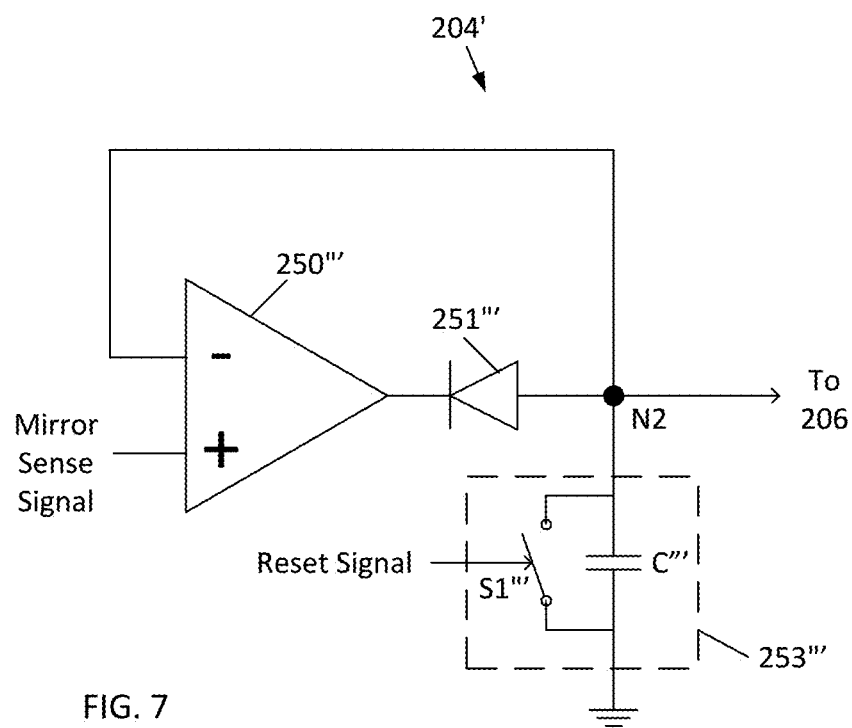
FIG. 7 is a schematic of another possible implementation of the negative peak detector of FIG. 3.

Second possible implementations of the positive peak detector 202 and negative peak detector 204 are now described with reference to FIGS. 6-7. As shown, the positive peak detector 202' includes a first operational amplifier 250" having a non-inverting terminal coupled to receive the mirror sense signal as input, and an inverting terminal coupled to output node N2 for feedback. A diode 251" is coupled between an output of the first operational amplifier 250" and node N2, with the anode being coupled to the output of the first operational amplifier 250" and the cathode being coupled to node N2.

A switched capacitor circuit 253" is coupled between the node N2 and ground. The switched capacitor circuit 253" includes a capacitor C" and a switch S1" in parallel, with the switch S1" being controlled by the reset signal from the control circuitry 210.

In operation, the mirror sense signal is buffered through the first operational amplifier 250", and through the diode 251" during the portions of the mirror sense signal where the current flow is positive. The reset signal is not asserted during the period, and thus the capacitor C" charges as the voltage of the mirror sense signal increases. As the voltage of the mirror sense signal decreases, the voltage across the capacitor C" remains the same as it is prevented from discharging by the diode 251". Therefore, by the end of the period of the mirror sense signal, the voltage across the capacitor C" represents the positive peak of the mirror sense signal, as seen at node N2. At the end of the period, the control circuitry 210 asserts the reset signal, closing the switch S1", discharging the capacitor C.

The structure of the negative peak detector 204' is the same as that of the positive peak detector 202', but with the cathode of the diode 251''' being coupled to the output of the first operational amplifier 251''', and the anode of the diode 251''' being coupled to node N2. Operation is also similar to that of the positive peak detector 202', except now current flows through the diode 251''' when the current of the mirror sense signal is negative, and not positive, to charge the capacitor C'''. Thus, as the voltage of the mirror sense signal decreases, the voltage across the capacitor C''' is driven lower in the negative direction, yet as the voltage of the mirror sense signal increases, the voltage across the capacitor C''' remains the same as it is prevented from discharging by the diode 251'''. Therefore, by the end of the period of the mirror sense signal, the voltage across the capacitor "C' represents the negative peak of the mirror sense signal. At the end of the period, the control circuitry 210 asserts the reset signal, closing the switch S1''', discharging the capacitor C'''.

Figure 8:
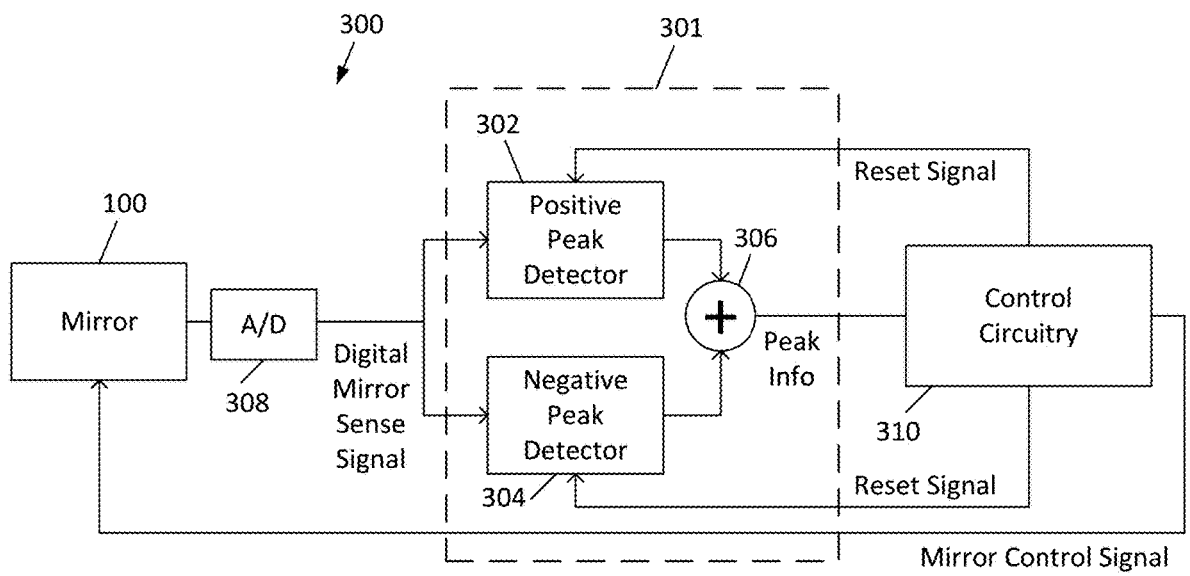
FIG. 8 is an alternate schematic for a circuit for determining the opening angle of the movable MEMS mirror of FIGS. 1-2.

Alternate configurations for the circuit 200 are now described. Shown in FIG. 8 is a variation where the circuit 300 includes an analog to digital converter 308 receiving the mirror sense signal and converting the mirror sense signal into a digital mirror sense signal. The peak detection circuit 301 here is therefore digital, and includes a digital positive peak detector 302 to determine the positive peak, a digital negative peak detector 304 to determine the negative peak, a digital combiner 306 to combine the positive peak and negative peak to produce the peak information.

The control circuitry 310 resets the digital positive peak detector 302 and digital negative peak detector 304 at the end of the period of the digital mirror sense signal. The control circuitry 310 also determines the opening angle of the mirror 100 from the peak information, and generates control signals for the mirror 100 from the opening angle θ of the mirror 100.

The digital positive peak detector 302, digital negative peak detector 304, and digital combiner 307 may be implemented using suitable digital logic, such as logic gates, which may be discrete components or integrated within a programmable logic device or field programmable gate array.

Figure 9:
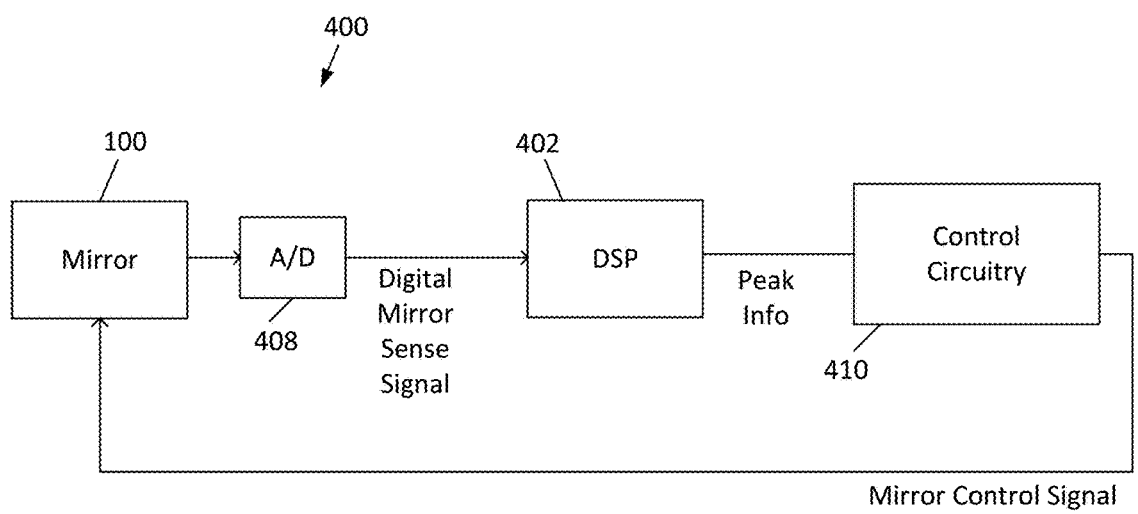
FIG. 9 is another alternate schematic for a circuit for determining the opening angle of the movable MEMS mirror of FIGS. 1-2.

In another alternate configuration for the circuit, shown in FIG. 9, the circuit 400 includes an analog to digital converter 308 receiving the mirror sense signal and converting the mirror sense signal into a digital mirror sense signal. A digital signal processing unit 402, with may be a programmed microprocessor or dedicated digital processing chip, performs Fourier analysis to determine the magnitude from the positive peak and negative peak, therefore to determine the peak information.

The control circuitry 410 determines the opening angle of the mirror 100 from the peak information, and generates control signals for the mirror 100 from the opening angle θ of the mirror 100.

Figure 10:
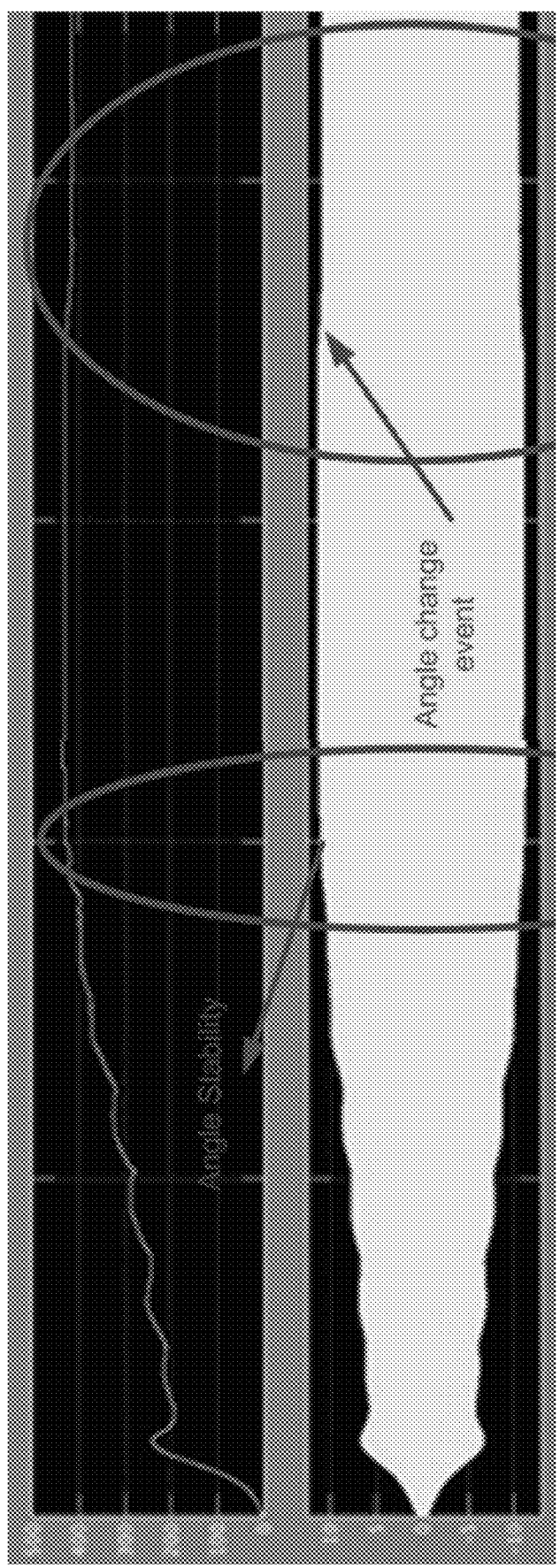
FIG. 10 is a graph of the opening angle of the movable MEMS mirror of FIGS. 1-2, as determined and controlled by the circuit of FIG. 3, 8, or 9.

Shown in FIG. 10, at the upper graph, are the results produced by the circuits 100, 200, 300 described above, showing the stable maintenance of the opening angle θ of the mirror 100 after an initial startup period, as well as the coherent detection of the opening angle θ during a planned angle change event. The upper graph shows the output of the envelope of the mirror 100 sense signal over time, while the lower graph shows the opening angle of the mirror θ over time.

Other circuits, techniques, and methods for determining and controlling the opening angle of the mirror θ are now described with reference to FIG. 11.

Figure 11:
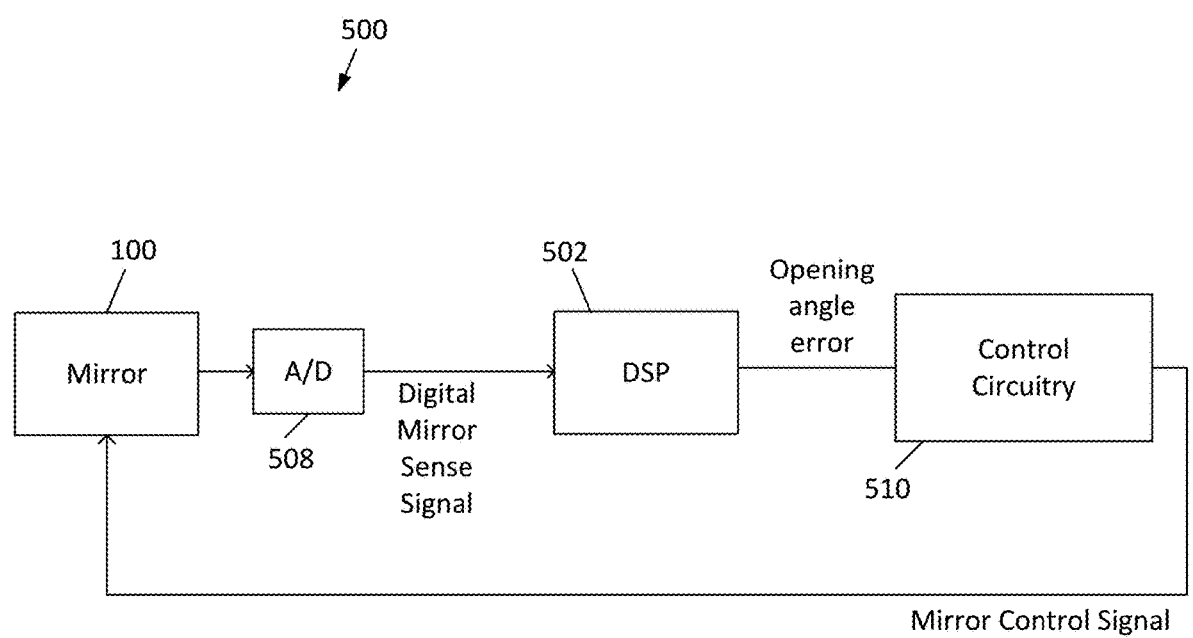
FIG. 11 is a schematic of a circuit for determining the opening angle of the movable MEMS mirror of FIGS. 1-2.

In the circuit 500 shown in FIG. 11, the circuit 500 includes an analog to digital converter (ADC) 508 receiving the mirror sense signal and converting the mirror sense signal into a digital mirror sense signal. A digital signal processing (DSP) unit 502, with may be a programmed microprocessor or dedicated digital processing chip, cooperates with the ADC 508 to sample the digital mirror sense signal at three times each meeting a specific condition, and the control circuitry 510 or DSSP 502 then uses those samples to determine the opening angle of the mirror 100, and generates control signals for the mirror 100 from the opening angle θ of the mirror 100.

In greater detail, each sample taken by the ADC 508 can be mathematically represented as:

$$\text{sample} = K(T)\frac{dC}{dt} + AmplifierBias(T)$$

where K(T) is a temperature dependent amplification factor of an amplifier outputting the mirror sense signal, AmplifierBias(T) is the bias of that amplifier, and C is the capacitance of the mirror 100.

Figure 12:
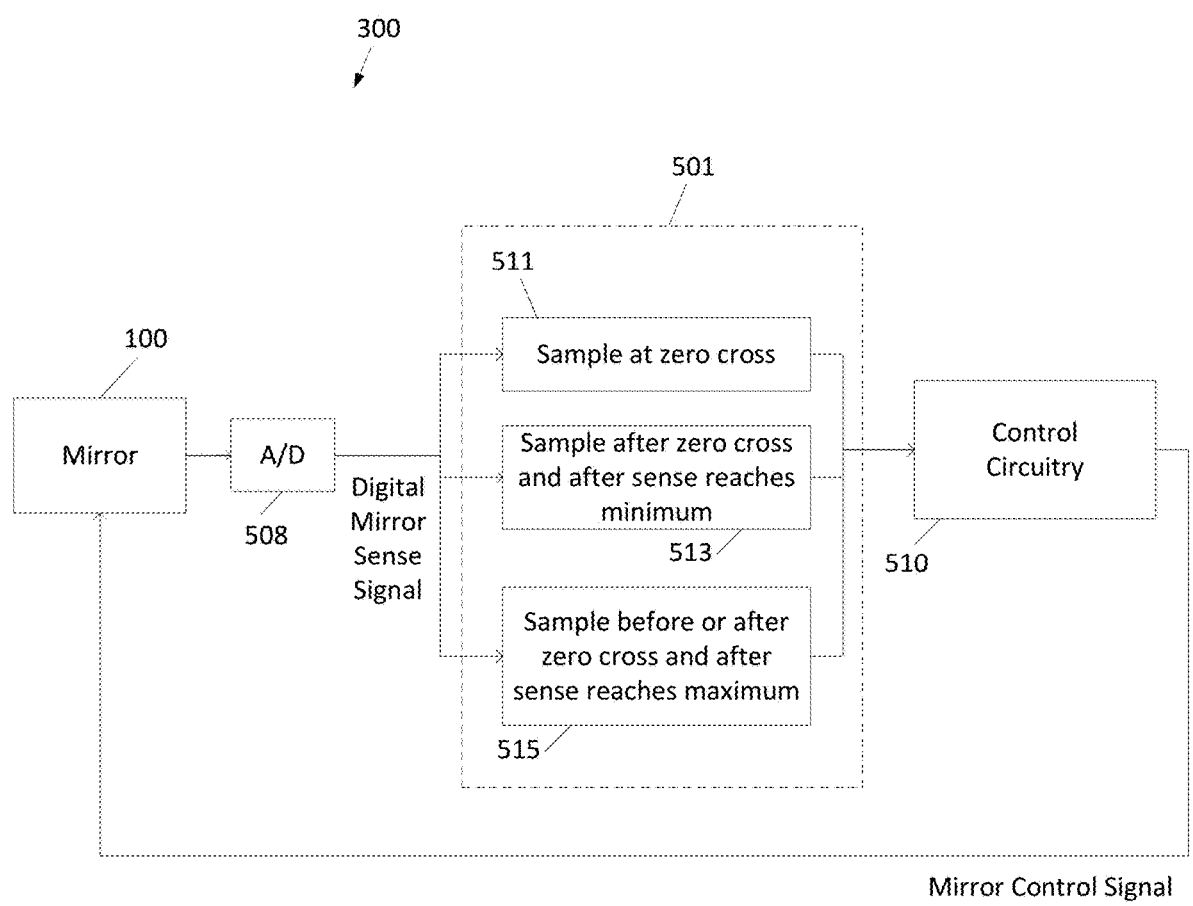
FIG. 12 is a schematic block diagram of the circuit of FIG. 11, showing specific functions for determining the opening angle of the movable MEMS mirror of FIGS. 1-2.

As shown in FIG. 12, the DSP 502 locates the following three samples taken by the ADC 508. First, $s_{zeroCross}$ taken when mirror angle θ equals zero (shown in FIGS. 13-14), where $$\frac{dC}{dt} = 0 (\text{Block } 511).$$

Figure 13:
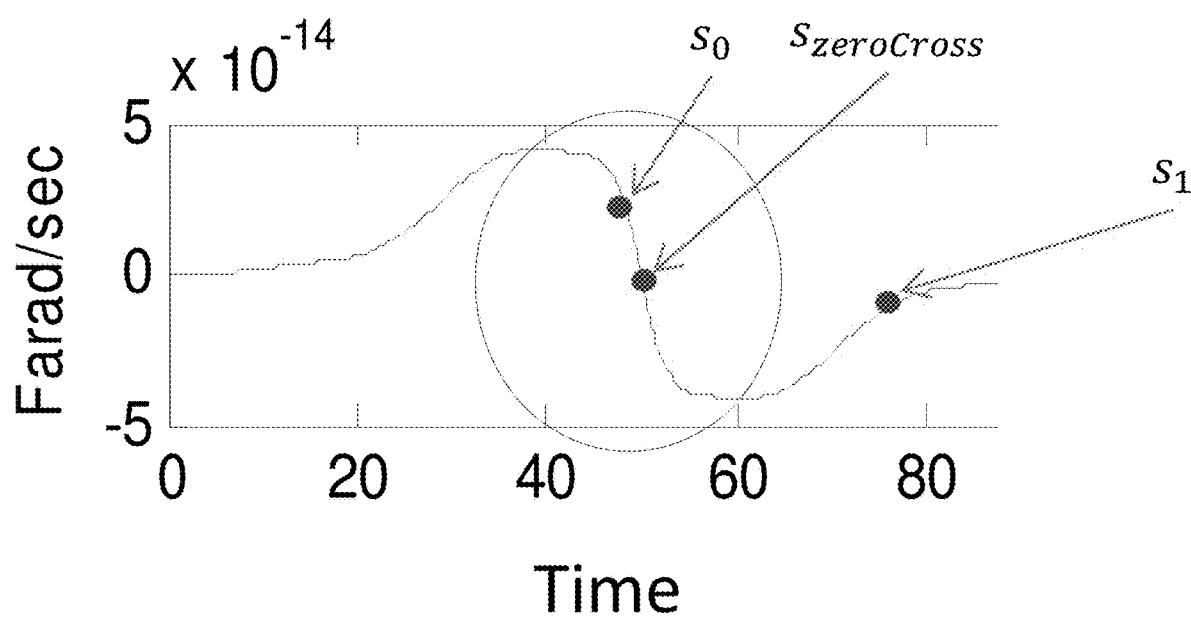
FIG. 13 is graph of the derivative of capacitance of the movable MEMS mirror of FIGS. 1-2 with respect to time vs. opening angle, showing the location of samples thereof taken by FIGS. 11-12.
Figure 14:
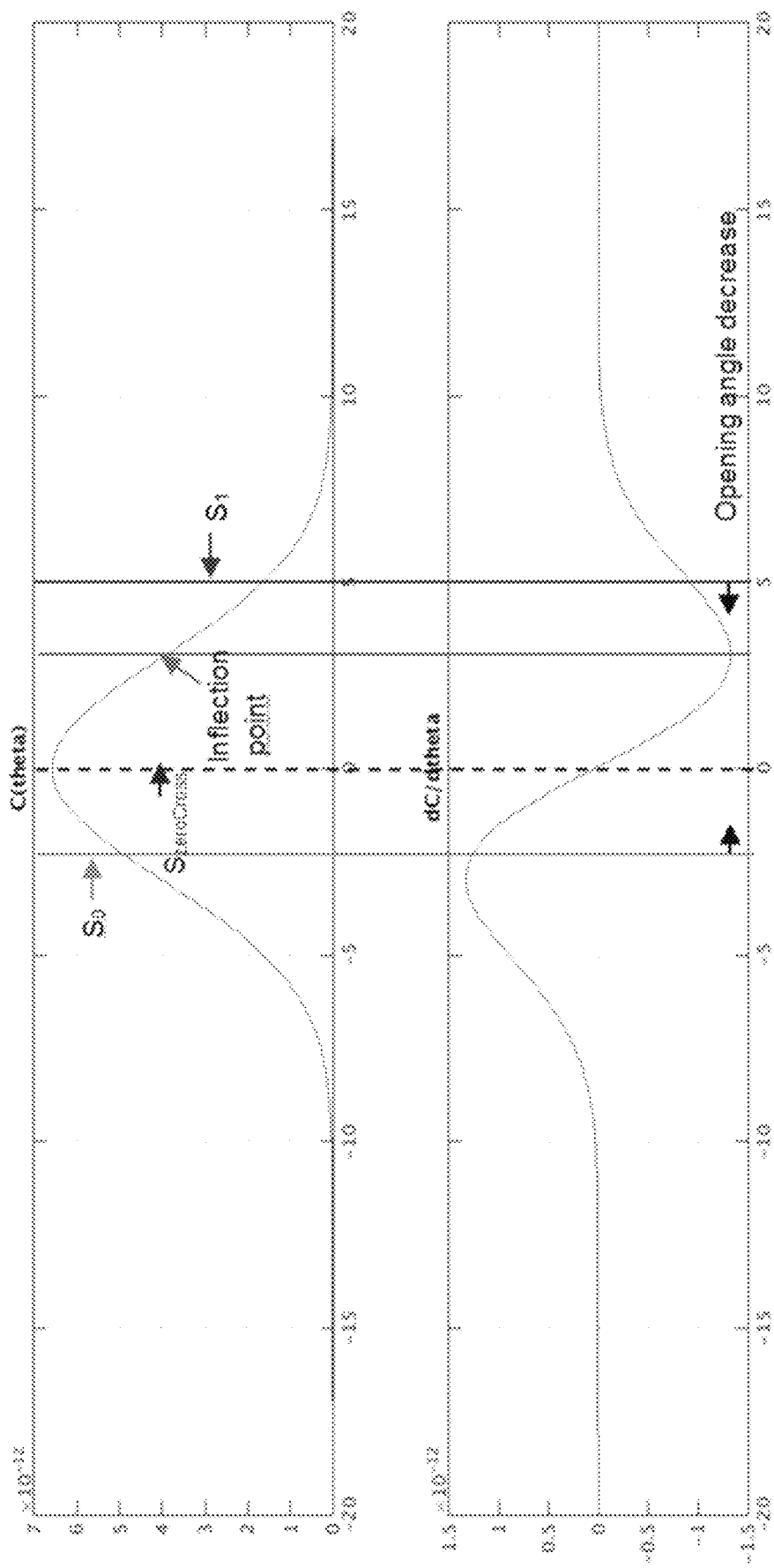
FIG. 14 are graphs of the capacitance of the movable MEMS mirror vs opening angle and the derivative of capacitance of the movable MEMS mirror of FIGS. 1-2 with respect to time, over time.

This value is the amplifier bias. Second, $s_0$, which is taken before or after $s_{zeroCross}$ and after the mirror sense signal reaches its peak (Block 513). Shown in FIGS. 13-14 is the case where $s_0$ is taken prior to $s_{zeroCross}$, and after or as the mirror sense signal reaches its minimum, although it may also be taken after $s_{zeroCross}$. Thereafter, $s_1$, taken after $s_{zeroCross}$, and after or as the mirror sense signal reaches its minimum (Block 515).

The control circuitry 510 then determines the opening angle θ of the mirror 100 as a function of $s_{zeroCross}$, $s_0$, and $s_1$. The control circuit 510 then determines a raw opening angle measurement as $$RawOAC_{Measurement} = \left|\frac{s_0 - s_{zeroCross}}{s_1 - s_{zeroCross}}\right|$$

It should be appreciated that the control circuitry 510 determines the opening angle once the phase of the mirror sense signal has locked, and thus $s_{zeroCross}$ is taken at the maximal point of the C(θ), as shown in FIG. 14, making $s_{zeroCross}$ the offset of the amplifier, so by subtracting it from the other samples, shown above, the offset is removed. The division of the samples removes the amplification factor K.

The control circuitry 510 determines an opening angle error as:

$$OAC_{ERR} = RawOAC_{Measurement} - \text{calibratedOacRatio}$$

where calibratedOacRatio is the $RawOAC_{Measurement}$ that was measured at a desired opening angle in a calibration process.

Thus, the control circuitry 510 can then generate the mirror control signal so as to maintain the opening angle error at a desired value to maintain the opening angle θ of the mirror 100 at a desired value.

In greater detail, mathematically speaking, the opening angle error $OAC_{ERR}$ is an injective function of the opening angle, thus it can be used by the control circuitry 510 make voltage changes that will help maintain the opening angle θ stabilized. First, it is to be noticed that:

$$\frac{dC}{dt} = \frac{dC}{d\theta}\frac{d\theta}{dt}$$

Analysis of the $$\frac{d\theta}{dt}$$

term shows that:

$$\frac{d\theta}{dt} = \omega\theta_{max}\sin(\omega t)$$

$RawOAC_{Measurement}$ may thus be written as:

$$\left|\frac{s_0 - s_1}{oac - s_1}\right| = \left|\begin{array}{c} K(T)\frac{dC(\theta_0)}{d\theta}\omega\theta_{max}\sin(\omega t_0) - \\ K(T)\frac{dC(\theta_{zeroCross})}{d\theta}\omega\theta_{max}\sin(\omega t_{zeroCross}) \\ K(T)\frac{dC(\theta_1)}{d\theta}\omega\theta_{max}\sin(\omega t_1) - \\ K(T)\frac{dC(\theta_{zeroCross})}{d\theta}\omega\theta_{max}\sin(\omega t_{zeroCross}) \end{array}\right|$$

$$= \left|\frac{\frac{dC(\theta_0)}{d\theta}}{\frac{dC(\theta_1)}{d\theta}}\right|\left|\frac{\sin(\omega t_0)}{\sin(\omega t_1)}\right|$$

where $$\left|\frac{\sin(\omega t_0)}{\sin(\omega t_1)}\right| = const,$$

since the samples are taken at a constant percent of mirror period. In summary, the $$\frac{d\theta}{dt}$$

this has no effect on the opening angle error.

As stated, the location of the above described samples is shown in FIG. 14. It should be noted that the sampled signal is correlated to the derivative of the capacitance. The $s_1$ sample timing is chosen to be after the inflection point in the $C(\theta)$ graph.

When the opening angle θ becomes smaller, the mirror 100 is slower, and $s_0$ and $s_1$ are sampled in smaller angles. When the opening angle θ becomes larger, $s_0$ and $s_1$ are sampled in larger angles. The effect of change in opening angle on the samples can be summarized in the following chart:

|  | Decrease in angle | Increase in angle |
|---|---|---|
| $\left\|\frac{dC(\theta_{s0})}{d\theta}\right\|$ | ↓ | ↑ |
| $\left\|\frac{dC(\theta_{szeroCross})}{d\theta}\right\|$ | 0 | 0 |
| $\left\|\frac{dC(\theta_1)}{d\theta}\right\|$ | ↑ | ↓ |

For example, if:

$$\theta' = \theta + \Delta\theta$$

The new raw OAC measurement will be:

$$RawOAC_{Measurement}(\theta') = const * \left|\frac{\frac{dC(\theta'_0)}{d\theta}}{\frac{dC(\theta'_1)}{d\theta}}\right| = const * \left|\frac{\frac{dC(\theta_0)}{d\theta} - \Delta_0}{\frac{dC(\theta_1)}{d\theta} + \Delta_1}\right| < RawOAC_{Measurement}(\theta)$$

Thus, pursuant to the above, the control circuitry 510 generates the mirror control signal to maintain the mirror 100 at a desired opening angle θ, or to change the mirror 100 from operating at one opening angle θ to another opening angle θ. The control circuitry 510 can also generate a stop signal to stop generation of a laser impinging on the mirror 100 where the opening angle error indicates that the mirror 100 has failed.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
   an envelope detector configured to receive a mirror sense signal from an oscillating mirror and to generate peak information for a mirror period as a function of the mirror sense signal, wherein the peak information includes an envelope of the mirror sense signal;
   a mirror control circuit configured to:
      estimate an opening angle of the oscillating mirror as a function of the peak information;
      generate a control signal for the oscillating mirror as a function of the estimated opening angle; and
      reset the envelope detector at an end of the mirror period.

2. The electronic device of claim 1, wherein the mirror control circuit is configured to generate a control signal that stops projection by a laser of light onto the oscillating mirror in response to the estimated opening angle being above a threshold angle.

3. The electronic device of claim 1, wherein the envelope detector generates the peak information by accumulating the mirror sense signal over the mirror period.

4. The electronic device of claim 1, wherein the peak information includes an amplitude of the mirror sense signal.

5. The electronic device of claim 1, further comprising an analog to digital converter configured to convert the peak information into digital peak information; and wherein the mirror control circuit estimates the opening angle as a function of the peak information.

6. The electronic device of claim 1, further comprising an analog to digital converter configured to convert the mirror sense signal into a digital mirror sense signal; and wherein the envelope detector generates the peak information as a function of the digital mirror sense signal.

7. The electronic device of claim 6, wherein the envelope detector comprises:
   a digital positive peak detector configured to determine a positive digital peak of the mirror sense signal;
   a digital negative peak detector configured to determine a negative digital peak of the mirror sense signal; and
   a combiner configured to generate the peak information as the envelope of the mirror sense signal by combining the positive digital peak and negative digital peak.

8. The electronic device of claim 6, wherein the envelope detector comprises digital signal processing circuitry configured to:
   determine a positive digital peak of the mirror sense signal;
   determine a negative digital peak of the mirror sense signal; and
   generate the peak information as an envelope of the mirror sense signal by combining the positive digital peak and negative digital peak.

9. An electronic device, comprising:
   a peak detection circuit configured to receive a mirror sense signal from an oscillating mirror and to generate peak information for a mirror period as a function of the mirror sense signal, wherein the peak detection circuit comprises:
      a positive peak detector configured to determine a positive peak of the mirror sense signal;
      a negative peak detector configured to determine a negative peak of the mirror sense signal; and
      a combiner configured to generate the peak information as an envelope of the mirror sense signal by combining the positive peak and negative peak;
   a mirror control circuit configured to:
      estimate an opening angle of the oscillating mirror as a function of the peak information;
      generate a control signal for the oscillating mirror as a function of the estimated opening angle; and
      reset the peak detection circuit at an end of the mirror period.

10. The electronic device of claim 9, wherein the positive peak detector comprises:
an output node;
a first amplifier having a first input terminal receiving the mirror sense signal, a second input terminal coupled to the output node as feedback, and an output terminal;
a diode having an anode coupled to the output terminal of the first amplifier and a cathode coupled to the output node; and
a switched capacitor circuit coupled between the output node and ground.

11. The electronic device of claim 10, wherein the switched capacitor circuit comprises a capacitor coupled between the output node and ground, and a switch coupled in parallel with the capacitor between the output node and ground, the switch being reset by the mirror control circuit at the end of the mirror period.

12. The electronic device of claim 10, wherein the negative peak detector comprises:
an output node;
a first amplifier having a first input terminal receiving the mirror sense signal, a second input terminal coupled to the output node as feedback, and an output terminal;
a diode having a cathode coupled to the output terminal of the first amplifier and an anode coupled to the output node; and
a switched capacitor circuit coupled between the output node and ground.

13. The electronic device of claim 9, wherein the positive peak detector comprises:
an output node;
a first amplifier having a first input terminal receiving the mirror sense signal, a second input terminal coupled to the output node for feedback, and an output terminal;
an intermediate node;
a diode having an anode coupled to the output terminal of the first amplifier and a cathode coupled to the intermediate node;
a switched capacitor circuit coupled between the intermediate node and ground; and
a second amplifier having a first terminal coupled to the intermediate node, a second input terminal coupled to the output node for feedback, and an output terminal coupled to the output node.

14. The electronic device of claim 13, wherein the switched capacitor circuit comprises a capacitor coupled between the intermediate node and ground, and a switch coupled in parallel with the capacitor between the intermediate node and ground, the switch being reset by the mirror control circuit at the end of the mirror period.

15. The electronic device of claim 9, wherein the negative peak detector comprises:
an output node;
a first amplifier having a first input terminal receiving the mirror sense signal, a second input terminal coupled to the output node for feedback, and an output terminal;
an intermediate node;
a diode having a cathode coupled to the output terminal of the first amplifier and an anode coupled to the intermediate node;
a switched capacitor circuit coupled between the intermediate node and ground; and
a second amplifier having a first terminal coupled to the intermediate node, a second input terminal coupled to the output node for feedback, and an output terminal coupled to the output node.

16. A method, comprising:
receiving a mirror sense signal from an oscillating mirror;
generating peak information for a mirror period as a function of the mirror sense signal, using an envelope detector, wherein the peak information includes an envelope of the mirror sense signal;
estimating an opening angle of the oscillating mirror as a function of the peak information; and
resetting the envelope detector at an end of the mirror period.

17. The method of claim 16, further comprising generating a fault signal where the estimated opening angle is less than a threshold opening angle, and generating a mirror control signal to control the oscillating mirror so as to recover the opening angle to being greater than the threshold opening angle.

18. The method of claim 16, further comprising generating control signals for the oscillating mirror as a function of the estimated opening angle.

19. A method, comprising:
receiving a mirror sense signal from an oscillating mirror;
generating peak information for a mirror period as a function of the mirror sense signal, using a peak detection circuit;
wherein generating the peak information comprises:
determining a positive peak of the mirror sense signal;
determining a negative peak of the mirror sense signal; and
generating the peak information as an envelope of the mirror sense signal by combining the positive peak and negative peak;
estimating an opening angle of the oscillating mirror as a function of the peak information; and
resetting the peak detection circuit at an end of the mirror period.

20. The method of claim 19, wherein determining the positive peak comprises:
buffering the mirror sense signal to a node through a diode in a first direction;
charging a capacitor coupled to the node with the buffered mirror sense signal to accumulate the mirror sense signal over the mirror period to thereby generate the peak information; and
discharging the capacitor at the end of the mirror period.

* * * * *